(12) United States Patent
Chou (10) Patent No.: US 12,040,269 B2
(45) Date of Patent: Jul. 16, 2024

(54) PREPARATION METHOD FOR LEADS OF SEMICONDUCTOR STRUCTURE, AND SEMICONDUCTOR STRUCTURE

(71) Applicant: CHANGXIN MEMORY TECHNOLOGIES, INC., Hefei (CN)

(72) Inventor: Chung Yen Chou, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 470 days.

(21) Appl. No.: 17/433,348

(22) PCT Filed: Mar. 15, 2021

(86) PCT No.: PCT/CN2021/080780
§ 371 (c)(1),
(2) Date: Aug. 24, 2021

(87) PCT Pub. No.: WO2021/208654
PCT Pub. Date: Oct. 21, 2021

(65) Prior Publication Data
US 2023/0141117 A1    May 11, 2023

(30) Foreign Application Priority Data
Apr. 17, 2020    (CN) .......................... 202010303243.8

(51) Int. Cl.
*H01L 23/528* (2006.01)
*H01L 21/311* (2006.01)
(Continued)

(52) U.S. Cl.
CPC .... *H01L 23/5283* (2013.01); *H01L 21/31116* (2013.01); *H01L 21/31144* (2013.01);
(Continued)

(58) Field of Classification Search
None
See application file for complete search history.

(56) References Cited

U.S. PATENT DOCUMENTS

| 7,416,976 B2 | 8/2008 | Willer et al. |
| 2009/0153008 A1 | 6/2009 | Yanagisawa et al. |

(Continued)

FOREIGN PATENT DOCUMENTS

| CN | 1925161 A | 3/2007 |
| CN | 109786359 A | 5/2019 |
| CN | 110928434 A | 3/2020 |

OTHER PUBLICATIONS

International Search Report cited in PCT/CN2021/080780 mailed Jun. 8, 2021, 8 pages.

*Primary Examiner* — Long Pham
(74) *Attorney, Agent, or Firm* — Syncoda LLC; Feng Ma (57) ABSTRACT

The present application relates to a preparation method for leads of semiconductor structure and semiconductor structure. The preparation method comprises: providing a substrate covered with a conductive layer, the substrate having a first region and a second region being connected with the first region at side surfaces; sequentially forming, on the conductive layer, a second dielectric layer, a first dielectric layer and a mask layer which are superposed one upon the other; etching the second dielectric layer for the first time; removing the mask layer in the first region; etching the second dielectric layer for the second time, forming, respectively in the first region and the second region, a first window and a second window; and etching the exposed conductive layer, forming leads comprising wide lines in the first region and narrow lines in the second region.

15 Claims, 9 Drawing Sheets

(51) Int. Cl.
*H01L 23/522* (2006.01)
*H10B 12/00* (2023.01)
(52) U.S. Cl.
CPC .......... *H01L 23/5226* (2013.01); *H10B 12/05* (2023.02); *H10B 12/482* (2023.02)

(56) References Cited

U.S. PATENT DOCUMENTS

| | | | |
|---|---|---|---|
| 2020/0089350 A1 | 3/2020 | Han | |
| 2022/0344251 A1* | 10/2022 | Fan | ..................... H01L 21/4857 |
| 2024/0023324 A1* | 1/2024 | Lin | ..................... H10B 12/482 |

* cited by examiner

FIG. 9b

PREPARATION METHOD FOR LEADS OF SEMICONDUCTOR STRUCTURE, AND SEMICONDUCTOR STRUCTURE

CROSS-REFERENCE TO RELATED APPLICATIONS

The present application claims the priority to Chinese Patent Application No. 202010303243.8, titled "Preparation method for leads of semiconductor structure, and semiconductor structure", filed to China National Intellectual Property Administration on Apr. 17, 2020, which is incorporated herein by reference in its entirety.

TECHNICAL FIELD

The present application relates to the field of semiconductors, and in particular, to a preparation method for leads of semiconductor structure and semiconductor structure.

BACKGROUND

Leads need to be laid in the semiconductor structure and the semiconductor structure needs to come into contact with the leads by contact pillars to realize the electrical connection between devices. At present, the leads are usually lines of equal width. With the improvement of device integration, the leads are required to have a smaller width. Correspondingly, the contact area between the contact pillars and the leads gets smaller, resulting in larger contact resistance. Meanwhile, when the width of the lines is too small, the width of the contact pillars is greater than the width of the lines. The contact pillars going beyond the lines may extend below the leads and may be electrically connected to the conductive region below the leads, causing a short circuit, which in turn affects the electrical performance of the device or even makes the device fail.

SUMMARY

According to various embodiments of the present application, a preparation method for leads of semiconductor structure and semiconductor structure are provided.

A preparation method for leads of semiconductor structure comprises:
  providing a substrate covered with a conductive layer, the substrate having a first region and a second region being connected with the first region at side surfaces;
  sequentially forming, on the conductive layer, a second dielectric layer, a first dielectric layer and a mask layer which are superposed one upon the other, the first dielectric layer being in a strip shape, the first dielectric layer and the second dielectric layer extending into the first region from the second region, the mask layer covering the first region and exposing the second region;
  etching the second dielectric layer for the first time;
  removing the mask layer in the first region to expose the first region;
  etching the second dielectric layer for the second time, forming, respectively in the first region and the second region, a first window and a second window exposing the conductive layer, the width of the bottom of the first window being less than the width of the bottom of the second window; and
  etching the exposed conductive layer, forming leads, the leads comprising wide lines in the first region and narrow lines in the second region, the line width of the wide lines being greater than the line width of the narrow lines.

A semiconductor structure comprises:
  a substrate;
  leads formed on the substrate, the leads comprising wide lines and narrow lines, the line width of the wide lines being greater than the line width of the narrow lines;
  an interlayer dielectric layer covering the leads; and
  contact pillars, penetrating the interlayer dielectric layer and being in contact with the wide lines.

In the semiconductor structure, the leads comprise narrow lines with a relatively small width and wide lines with a relatively large width. The narrow lines still meet the requirement on high integration, while the wide lines are in contact with the contact pillars. Thus, the contact resistance can be reduced, and the contact pillars can be prevented from extending below the leads to cause a short circuit.

BRIEF DESCRIPTION OF THE DRAWINGS

The above and other objectives, features and advantages of the present application will become apparent through the more detailed description of the preferred embodiments of the present application shown in the drawings. Throughout the figures, the same reference numerals indicate the same parts, and the figures are not necessarily drawn to scale. The focus is to show the gist of the present application.

FIG. 1b is a side cross-sectional view at the section line AA' of FIG. 1a;

FIGS. 3b and 3c are respectively side cross-sectional views of the second region and the first region of FIG. 3a;

FIGS. 4b and 4c are respectively side cross-sectional views of the second region and the first region of FIG. 4a;

FIGS. 5b and 5c are respectively side cross-sectional views of the second region and the first region of FIG. 5a;

FIGS. 6b and 6c are respectively side cross-sectional views of the second region and the first region of FIG. 6a;

FIGS. 7b and 7c are respectively side cross-sectional views of the second region and the first region of FIG. 7a;

FIGS. 8b and 8c are respectively side cross-sectional views of the second region and the first region of FIG. 8a;

DETAILED DESCRIPTION

In order to make the above objectives, features and advantages of the present application more obvious and understandable, the specific implementations of the present application will be described in detail below with reference to the accompanying drawings. In the following description, many specific details are provided in order to fully understand the present application. However, the present application may be implemented in many other ways different from those described herein, and those skilled in the art can make similar improvements without departing from the spirit of the present application. Therefore, the present application is not limited by the specific implementations disclosed below.

Unless otherwise defined, all technical and scientific terms used herein have the same meaning as commonly understood by a person of ordinary skill in the art to which the present application belongs. Here, terms used in the description of the present application are merely intended to describe specific embodiments, rather than limiting the present application. As used herein, the term "and/or" includes any or all of one or more associated listed items or combinations thereof.

Figure 1A:
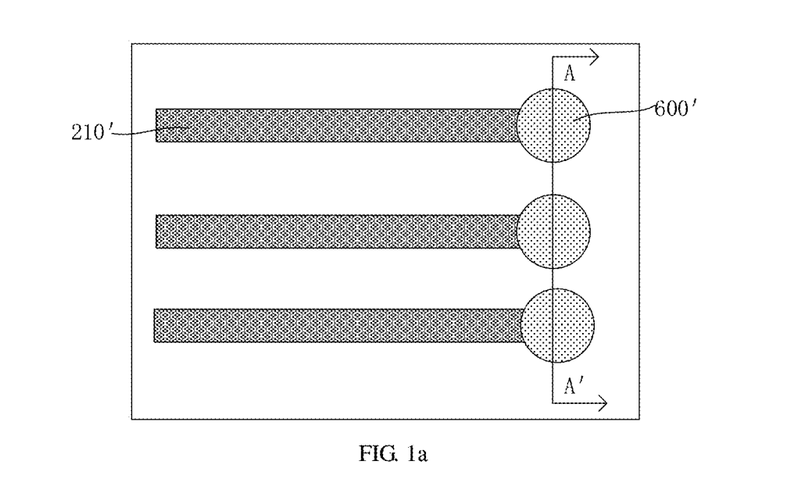
FIG. 1a is a top view of the contact between the leads and the contact pillars in the traditional technology.
Figure 1B:
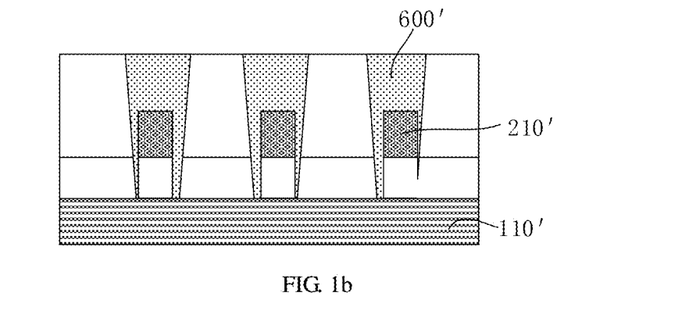

In the traditional technology, as shown in FIG. 1a and FIG. 1b, the leads 210' laid in the semiconductor structure are usually strips of equal width, and the contact pillars 600' penetrate the interlayer dielectric layer to contact the end of the leads 210' to realize the electric connection of the device. As the degree of integration increases, the width of the leads 210' is getting smaller to meet the requirement on the degree of integration. However, as the width of the leads 210' decreases, the contact area between the contact pillars 600' and the leads 210' decreases, which causes the contact resistance between the contact pillars 600' and the leads 210' to increase and thus weakens the electrical performance of the device. Meanwhile, the contact pillars 600' are formed by forming contact holes above the leads 210' and filling the contact holes with a conductive material. When the width of the leads 210' is too small, the width of the formed contact holes is greater than the width of the leads 210'. During the formation of the contact holes, the part of the contact holes beyond the leads 210' is not blocked by the leads 210', which may cause the contact holes to be over-etched and extend to the conductive region 110' below the leads. In this case, the contact pillars 600' will cause a short circuit with the conductive region 110' below the leads 210' to make the device fail.

Figure 2:
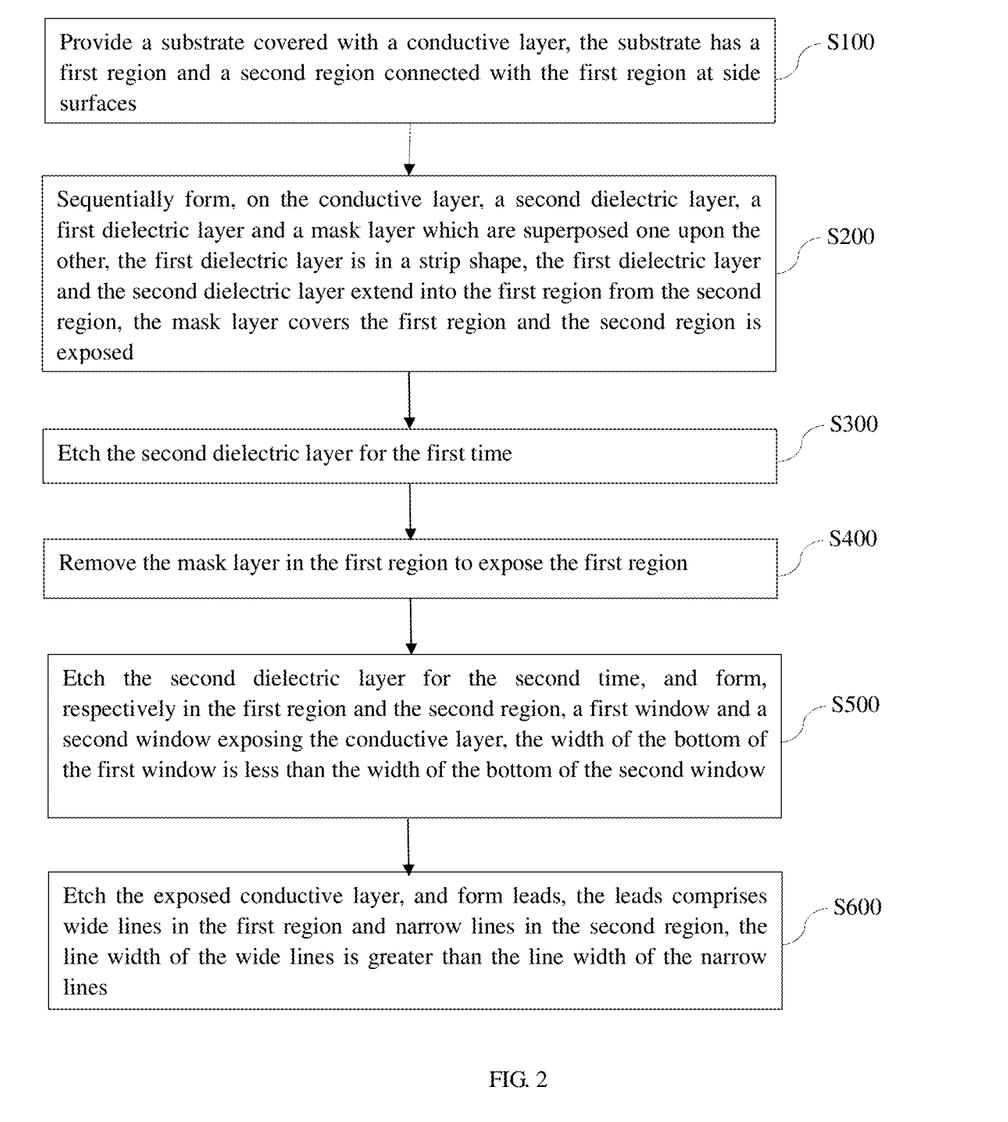
FIG. 2 is a flowchart of steps of a preparation method for leads of semiconductor structure in the present application.

In order to solve the technical problems, the present application provides a preparation method for leads of semiconductor structure. As shown in FIG. 2, the preparation method for leads of semiconductor structure comprises at least the following steps.

S100: A substrate covered with a conductive layer is provided, the substrate having a first region and a second region being connected with the first region at side surfaces.

Figure 3A:
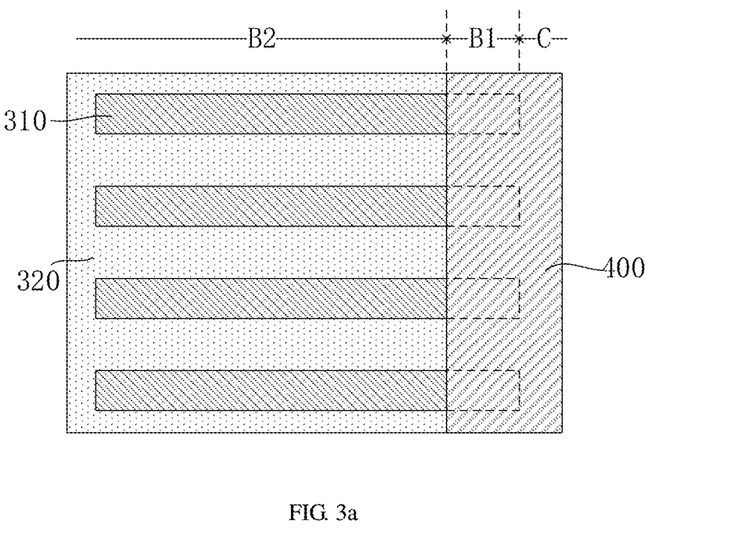
FIG. 3a is a top view of the structure after the mask layer is formed.
Figure 3B:
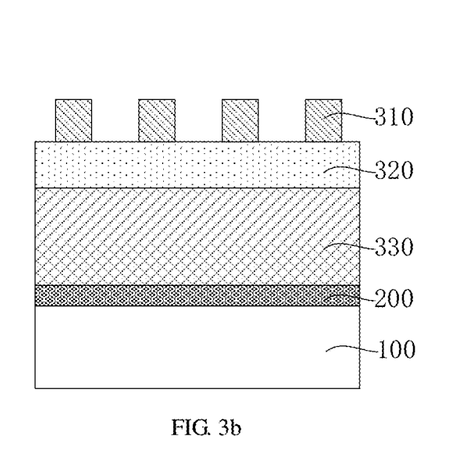
Figure 3C:
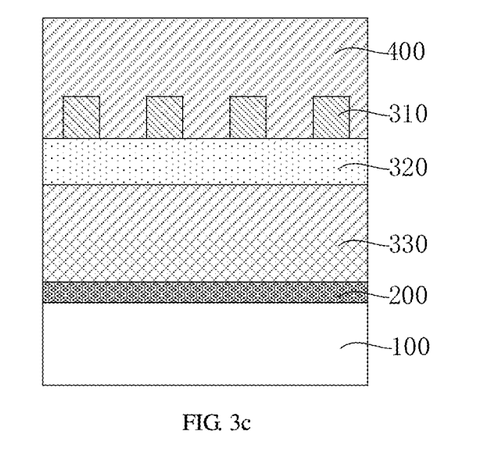

As shown in FIGS. 3a to 3c, a substrate 100 is provided. The substrate 100 has a working region. The working region is divided into a first region B1 and a second region B2 being connected with the first region at side surfaces, that is, the first region B1 and the second region B2 adjoin each other and are arranged side by side on the same plane. The conductive layer 200 covers the substrate 100, that is, the conductive layer 200 covers the first region B1 and the second region B2.

It should be noted that an active region is formed in the substrate 100, and the active region needs to be connected to electrical signals through leads. The specific structure of the substrate 100 is not limited herein.

S200: A second dielectric layer, a first dielectric layer and a mask layer which are superposed one upon the other are sequentially formed on the conductive layer, the first dielectric layer being in a strip shape, the first dielectric layer and the second dielectric layer extending into the first region from the second region, the mask layer covering the first region and exposing the second region.

Still referring to FIGS. 3a to 3c, a second dielectric layer 320, a first dielectric layer 310, and a mask layer 400 which are superposed one upon the other are sequentially formed on the conductive layer 200. The second dielectric layer 320 covers the entire conductive layer 200. The first dielectric layer 310 is in a strip shape, specifically a strip shape of equal width, that is, the first dielectric layer 310 covers only part of the second dielectric layer 320 and exposes part of the second dielectric layer 320. The first dielectric layer 310 and the second dielectric layer 320 are both in the second region B2 and extend from the second region B2 to the first region B1. The mask layer 400 covers the first region B1 and exposes the second region B2. The side cross-sectional view of the second region B2 where the mask layer 400 is not formed is shown in FIG. 3b, and the side cross-sectional view of the first region B1 where the mask layer 400 is formed is shown in FIG. 3c.

In an embodiment, between the second dielectric layer 320 and the conductive layer 200, more dielectric layers may be provided as needed. For example, as shown in FIG. 3b or FIG. 3c, a third dielectric layer 330 is further provided below the second dielectric layer 320.

S300: The second dielectric layer is etched for the first time.

Figure 4A:
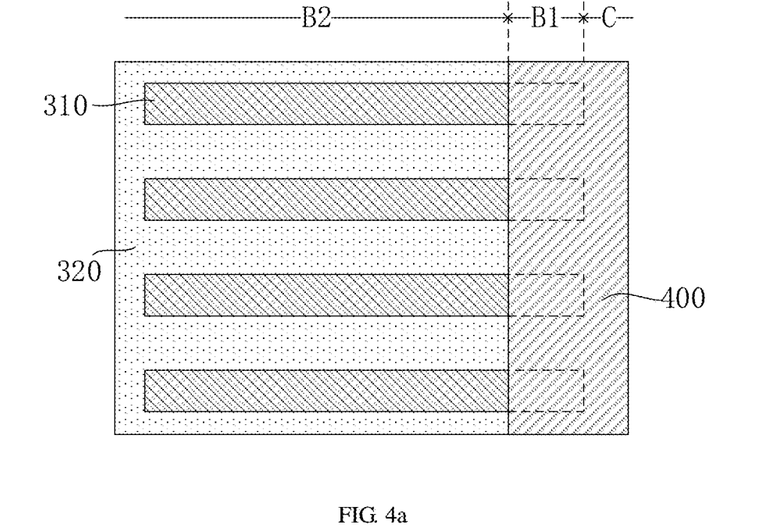
FIG. 4a is a top view of the structure after the exposed second dielectric layer is etched for the first time.
Figure 4B:
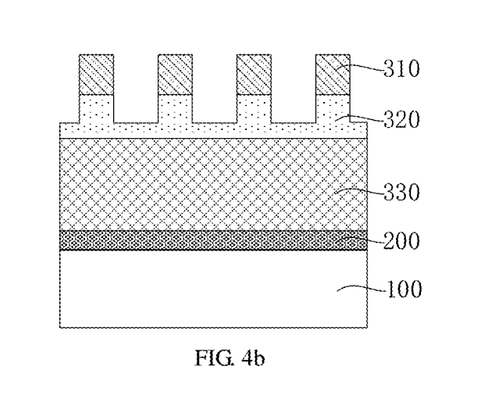
Figure 4C:
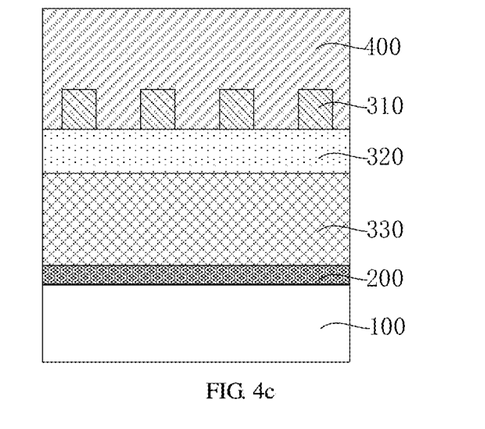

Still referring to FIGS. 4a to 4c, the second dielectric layer 320 is etched for the first time. It may be understood that the first etching of the second dielectric layer 320 is to etch the exposed second dielectric layer 320 for the first time. In this case, since the first region B1 is protected by the mask layer 400, the second dielectric layer 320 in the first region B1 is not affected by the first etching and the first etching etch only the exposed second dielectric layer 320 in the second region B2.

In an embodiment, after the first etching in the step S300, the whole second dielectric layer 320 exposed in the second region B2 can be etched away. In another embodiment, since the exposed second dielectric layer 320 will be etched for the second time in the subsequent process, in the first etching in the step S300, only the top part of the exposed second dielectric layer 320 in the second region B2 may be etched away, while the bottom part thereof is left. That is, only part of the exposed second dielectric layer 320 in the second region B2 is etched away, and the remaining exposed second dielectric layer 320 in the second region B2 is then etched away during the subsequent second etching of the exposed second dielectric layer 320. This can save the etching cost. FIGS. 4a to 4c are schematic diagrams after only part of the exposed second dielectric layer 320 in the second region B2 is etched away, wherein FIG. 4b is a side cross-sectional view of the second region B2 where the mask layer 400 is not formed, and FIG. 4c is a side cross-sectional view of the first region B1 where the mask layer 400 is formed.

S400: The mask layer in the first region is removed to expose the first region.

Figure 5A:
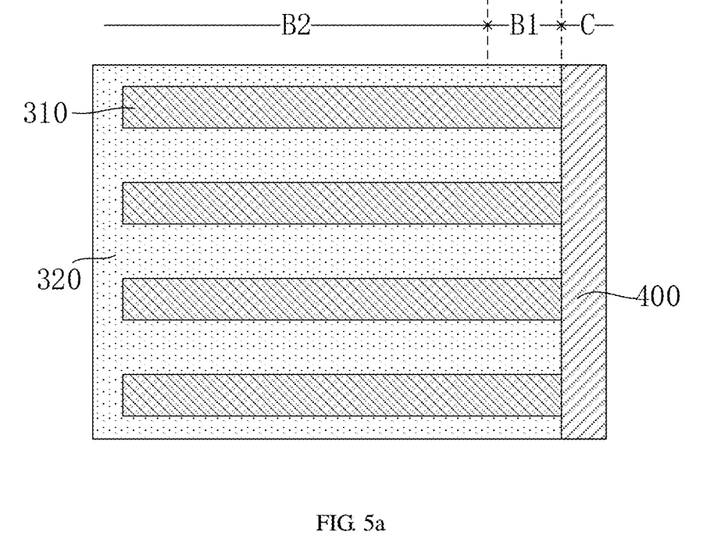
FIG. 5a is a top view of the structure after the mask layer in the first region is removed.
Figure 5B:
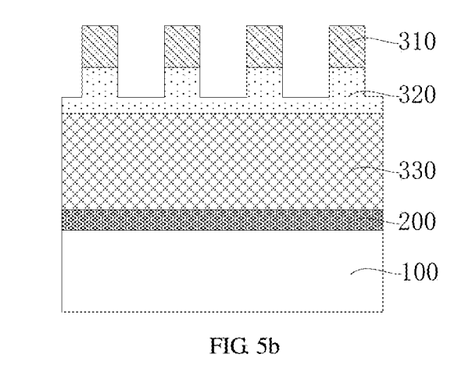
Figure 5C:
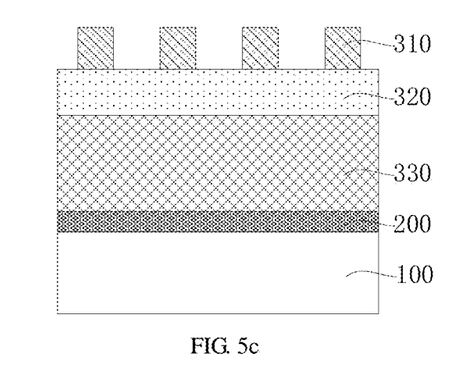

As shown in FIGS. 5a to 5c, the mask layer 400 in the first region B1 is removed to expose the first region B1. That is, the first dielectric layer 310 and the second dielectric layer 320 in the first region are exposed. FIG. 5b is a side cross-sectional view of the second region B2, and FIG. 5c is a side cross-sectional view of the first region B1. In this case, the height of the second dielectric layer 320 exposed in the first region B1 is higher than the height of the second dielectric layer 320 in the second region B2.

In an embodiment, the substrate 100 further has a peripheral region C which is located on a side of the first region B1 away from the second region B2. In addition to covering the first region B1, the mask layer 400 also covers the peripheral region C to protect the peripheral region C.

In this case, the step S400 specifically comprises: carrying out isotropic etching on the mask layer 400, removing the mask layer 400 in the first region B1 and reserving the mask layer 400 in the peripheral region C, to expose the first region B1.

Still referring to FIGS. 5a to 5c, the mask layer 400 is etched by isotropic etching. According to the nature of the isotropic etching, the top and sides of the mask layer 400 will be etched, so that the thickness of the mask layer 400 is reduced and its coverage region is reduced from the sides to the middle. Therefore, through the isotropic etching, the mask layer 400 covering the first region B1 can be etched away, reserving the mask layer 400 in the peripheral region C. The remaining mask layer 400 can continuously protect the peripheral region C. Specifically, the isotropic etching is isotropic dry etching.

S500: The second dielectric layer is etched for the second time to form, respectively in the first region and the second region, a first window and a second window exposing the conductive layer, the width of the bottom of the first window being less than the width of the bottom of the second window.

It may be understood that the second etching of the second dielectric layer 320 is to etch the exposed second dielectric layer 320 for the second time to form, respectively in the first region B1 and the second region, a first window and a second window exposing the conductive layer 200.

In this case, if the first etching in the step S300 has etched away the whole second dielectric layer 320 exposed in the second region B2, the second etching in this step is to etch only the exposed second dielectric layer 320 in the first region B1. If, after the first etching in the step S300, there is still the exposed second dielectric layer 320 in the second region B2, the second etching in this step will remove both the remaining exposed second dielectric layer 320 in the second region B2 320 and the exposed second dielectric layer 320 in the first region B1, thereby forming a window exposing the conductive layer 200.

In an embodiment, a third dielectric layer 330 is further formed between the conductive layer 200 and the second dielectric layer 320. In this case, the step S500 comprises the following steps.

S510: The second dielectric layer is etched for the second time to form, respectively in the first region and the second region, a first groove and a second groove exposing the third dielectric layer, the width of the bottom of the first groove being less than the width of the bottom of the second groove.

Figure 6A:
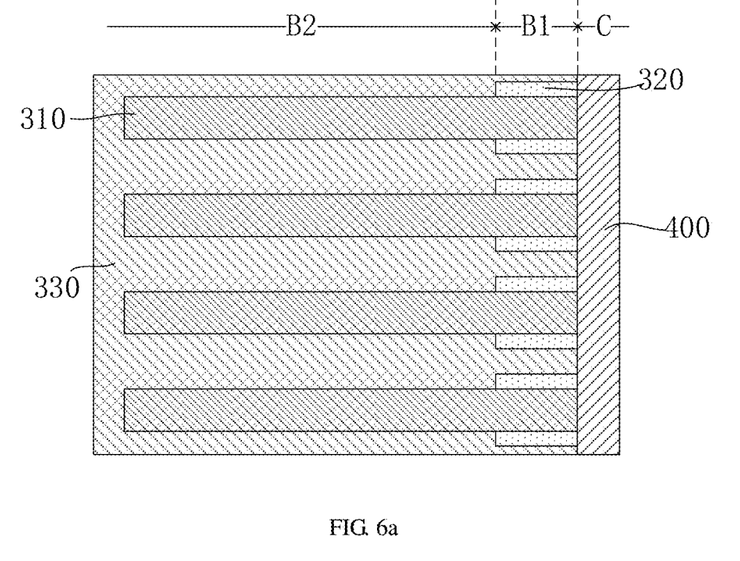
FIG. 6a is a top view of the structure after the exposed second dielectric layer is etched for the second time.
Figure 6B:
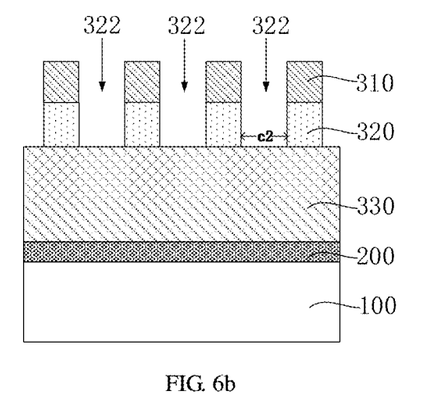
Figure 6C:
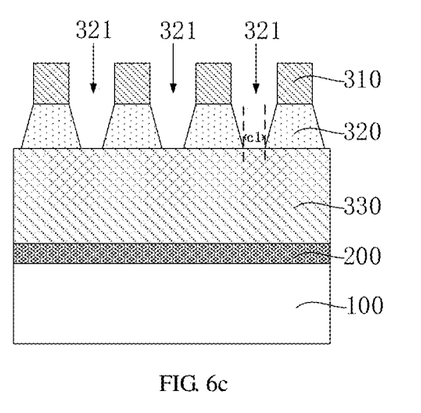

As shown in FIGS. 6a to 6c, the exposed second dielectric layer 320 is etched for the second time to form, respectively in the first region B1 and the second region B2, a first groove 321 and a second groove 322 exposing the third dielectric layer 330, the width c1 of the bottom of the first groove 321 in the first region B1 being less than the width c2 of the bottom of the second groove 322 in the second region B2. That is, the width of the third dielectric layer 330 exposed through the first groove 321 in the first region B1 is less than the width of the third dielectric layer 330 exposed through the second groove 322 in the second region B2.

In an embodiment, in the step S300, etching the second dielectric layer 320 for the first time specifically comprises etching the exposed second dielectric layer 320 in a vertical direction. At least the top part of the side cross-section of the second groove 322 is rectangular. In the step S500, etching the second dielectric layer 320 for the second time comprises etching the exposed second dielectric layer 320 in an inclined direction. The side cross-section of the first groove 321 is an inverted trapezoid. That is, the width of the top of the first groove 321 is greater than the width of the bottom.

Specifically, when the first etching in the step S300 has etched away the whole second dielectric layer 320 exposed in the second region B2, a second groove 322 may be formed in the step S300. In this case, the side cross-section of the second groove 322 is rectangular, that is, the width of the top of the second groove 322 is the same as the width of the bottom; after the first etching in the step S300, there is still the exposed second dielectric layer 320 in the second region B2, that is, the second dielectric layer 320 exposed in the second region B2 undergoes the first etching and the second etching. Then, the second groove 322 is formed in the step S500, and the second groove 322 formed after the second etching may have a slight slope on the bottom sidewall. In either case, it can be ensured that the width c1 of the bottom of the first groove 321 is less than the width c2 of the bottom of the second groove 322.

In another embodiment, both the first etching in the step S300 and the second etching in the step S500 may be inclined etching. The width of the bottom of the first groove 321 is less than the width of the bottom of the second groove 322, as long as it is ensured that the degree of inclination in the first etching is greater than that in the second etching.

S520: The exposed third dielectric layer is etched by anisotropic dry etching in a vertical direction to form, respectively in the first region and the second region, a first window and a second window exposing the conductive layer.

Figure 7A:
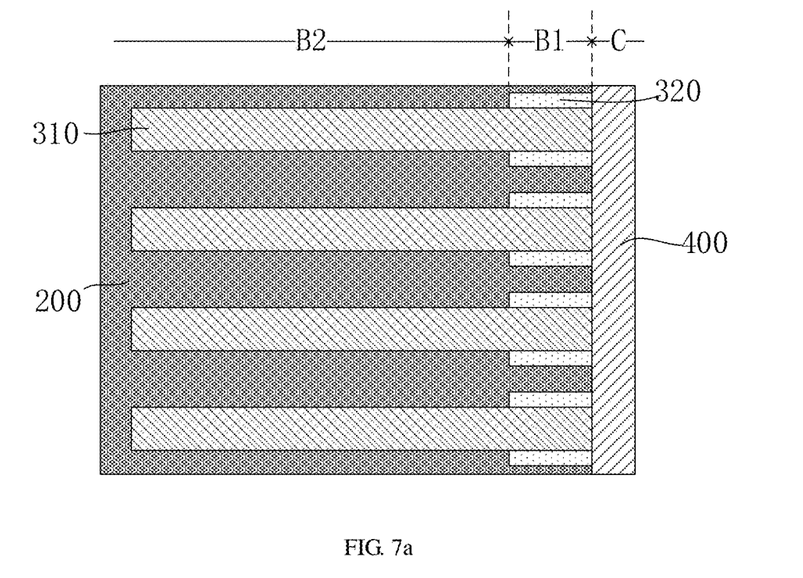
FIG. 7a is a top view of the structure after the exposed third dielectric layer is etched.
Figure 7B:
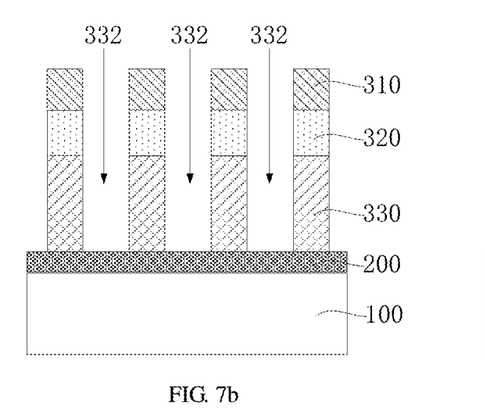
Figure 7C:
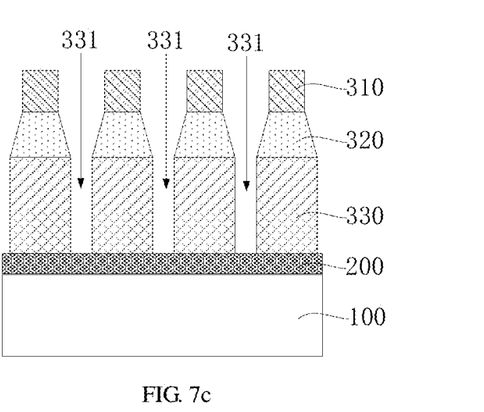

As shown in FIGS. 7a to 7c, the exposed third dielectric layer 330 is etched by anisotropic dry etching in the vertical direction to respectively increase the depth of the first groove 321 and the second groove 322 to form, in the first region B1 and the second region B2, a first window 331 and a second window 332 exposing the conductive layer 200.

S600: The exposed conductive layer is etched to form leads, the leads comprising wide lines in the first region and narrow lines in the second region, the line width of the wide lines being greater than the line width of the narrow lines.

Figure 8A:
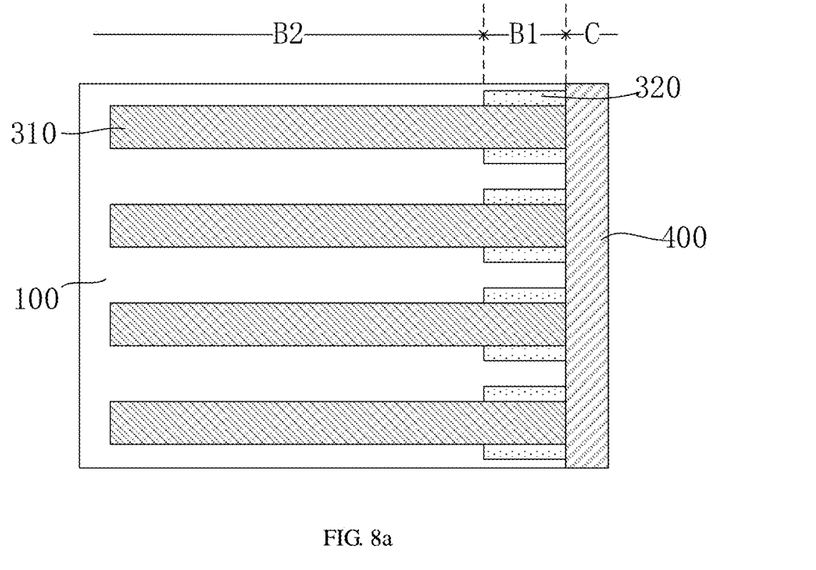
FIG. 8a is a top view of the structure after the exposed conductive layer is etched.
Figure 8B:
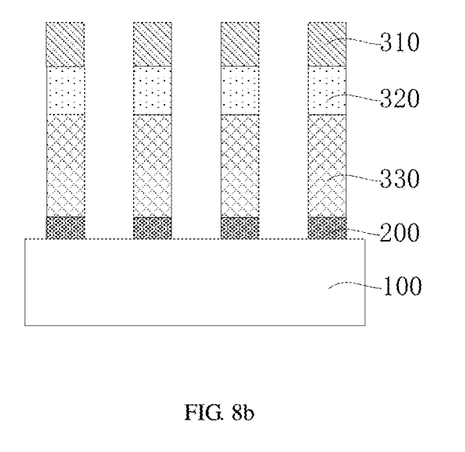
Figure 8C:
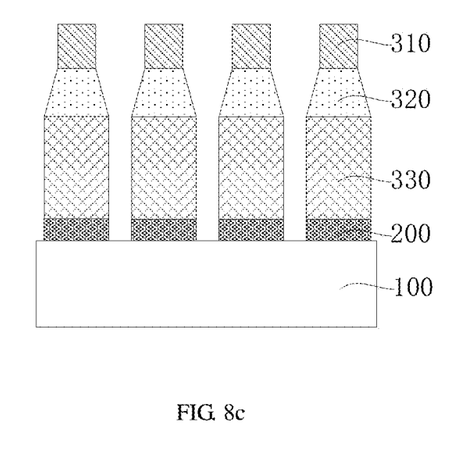

As shown in FIGS. 8a, 8b, and 8c, the exposed conductive layer 200 is removed, and the remaining conductive layer 200 forms the laid leads 210.

Figure 9A:
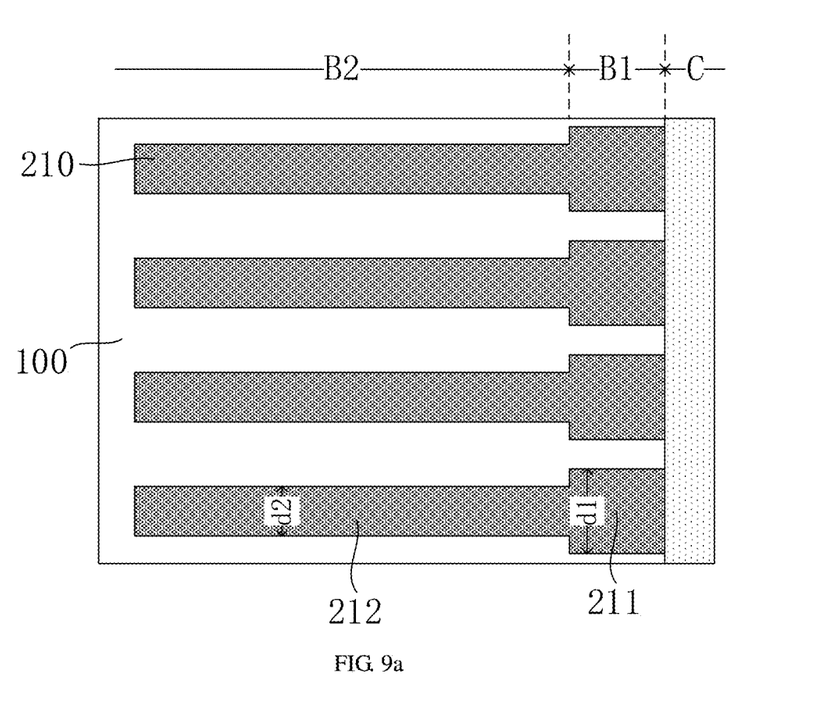
FIG. 9a is a schematic structure diagram of the formed leads.
Figure 9B:
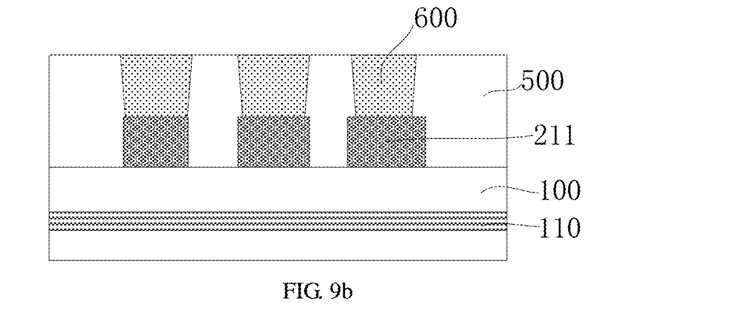
FIG. 9b is a side structure view in which the contact pillars are in contact with the leads.

In the above steps, the second dielectric layer 320 exposed in the second region B2 and the first region B1 is etched separately by the step S300 and step S500; and by controlling the etching conditions during the two etching processes, the topography of the first window 331 in the first region B1 that exposes the conductive layer 200 and the second window 332 in the second region B2 that exposes the conductive layer 200 may be controlled, so that the width of the bottom of the first window 331 is less than the width of the bottom of the second window 332. Therefore, the width of the conductive layer 200 etched away in the first region B1 is less than the width of the conductive layer 200 etched in the second region B2, and the conductive layer that is not etched away forms the leads. As shown in FIG. 9a, wide lines 211 are formed in the first region B1, and narrow lines 212 are formed in the second region B2. The line width d1 of the wide lines 211 is greater than the line width d2 of the narrow lines 212. In this case, as shown in FIG. 9b, the wide lines 211 may be used to contact the contact pillars 600, thereby increasing the contact area between the leads 210 and the contact pillars 600 and reducing the contact resistance between the leads 210 and the contact pillars 600. Furthermore, the large width of the wide lines 211 can prevent the contact pillars 600 from extending into the substrate 100 below the leads 210 to cause a short circuit with the conductive region 110 below the leads 210.

In an embodiment, after the step S600, the method further comprises:

S700: Contact pillars in contact with the wide lines are formed over the first region.

As shown in FIG. 9b, an interlayer dielectric layer 500 is formed above the leads 210, and contact pillars 600 penetrating the interlayer dielectric layer 500 and contacting the wide lines are formed over the first region B1. In this case, the contact area between the leads 210 and the contact pillars 600 is large, and the contact resistance between the leads 210 and the contact pillars 600 is low. Furthermore, the large width of the wide lines 211 can prevent the contact pillars 600 from extending into the substrate 100 below the leads 210 to cause a short circuit with the conductive region 110 below the leads 210.

In an embodiment, a source region and a drain region are formed in the substrate 100, and the narrow lines 212 of the leads 210 are electrically connected to the source region or the drain region. Specifically, the semiconductor structure may be a dynamic random access memory (DRAM). Further, the leads 210 may be bit lines of the DRAM. Of course, the leads 210 may be metal wires or any other wiring that improves electrical connection for semiconductor structure.

The etching rates for the first dielectric layer 310, the second dielectric layer 320, the third dielectric layer 330, and the mask layer 400 are different. Specifically, the first dielectric layer 310 may comprise a silicon oxide layer, the second dielectric layer 320 may comprise a silicon oxynitride layer, and the third dielectric layer 330 may comprise an amorphous carbon layer. Specifically, the conductive layer 200 is a metal layer, and the formed leads 210 are metal leads 210. It should be noted that the selection of materials for the layers is not limited to the materials listed above, and other materials may be used as long as the etching rates for the layers are different.

In the preparation method for leads of semiconductor structure, on the basis of the original process, it is unnecessary to change the stripe size of the first dielectric layer. By covering the mask layer in the first region, the second dielectric layer is etched twice by two different etching processes to form windows with different shapes in the first region and the second region, so the width of the conductive layer exposed in the first region and the second region is different. The width of the conductive layer exposed in the first region is less than the width of the conductive layer exposed in the second region. After the exposed conductive layer is etched, the width of the etched conductive layer in the first region is less than the width of the etched conductive layer in the second region, and the width of the non-etched conductive layer in the first region is greater than the width of the non-etched conductive layer in the second region. The non-etched conductive layer forms the leads. The leads obtained by the preparation method have wide lines in the first region and narrow lines in the second region. The narrow lines in the second region still meet the requirement on high integration, while the leads in the first region may be used for contact with the contact pillars. Thus, the contact resistance between the leads and the contact pillars is reduced, and the contact pillars are prevented from extending below the leads to cause a short circuit.

The present application further relates to semiconductor structure. As shown in FIG. 9a and FIG. 9b, the semiconductor structure comprises:

a substrate 100;

leads 210 formed on the substrate 100, the leads 210 comprising wide lines 211 and narrow lines 212, the line width of the wide lines 211 being greater than the line width of the narrow lines 212;

an interlayer dielectric layer 500 covering the leads 210; and contact pillars 600, penetrating the interlayer dielectric layer 500 and being in contact with the wide lines 211.

In the semiconductor structure, the laid leads 210 comprise narrow lines 212 with a relatively small width and wide lines 211 with a relatively large width. The narrow lines 212 still meet the requirement on high integration, while the wide lines 211 are in contact with the contact pillars 600. Thus, the contact resistance can be reduced, and the contact pillars 600 can be prevented from extending below the leads 210 to cause a short circuit.

The wide lines 211 are located at the end of the leads 210, that is, the contact pillars 600 are in contact with the end of the leads 210. Further, an active region and a drain region are formed in the substrate 100, and the narrow lines 212 are electrically connected to the source region or the drain region. Specifically, the semiconductor structure may be a dynamic random access memory (DRAM). The leads 210 may be bit lines of the DRAM. Of course, the leads 210 may be metal wires or any other wiring that improves electrical connection for semiconductor structure.

Various technical features of the above embodiments can be arbitrarily combined. For simplicity, all possible combinations of various technical features of the above embodiments are not described. However, all those technical features shall be included in the protection scope of the present application if not conflict.

The embodiments described above merely represent certain implementations of the present application. Although those embodiments are described in more specific details, it is not to be construed as any limitation to the scope of the present application. It should be noted that, for a person of ordinary skill in the art, a number of variations and improvements may be made without departing from the concept of the present application, and those variations and improvements should be regarded as falling into the protection scope of the present application. Therefore, the protection scope of the present application should be subject to the appended claims.

The invention claimed is:

1. A preparation method for leads of a semiconductor structure, comprising:
provinding a substrate covered with a conductive layer, the substrate having a first region and a second region being connected with the first region at side surfaces;
sequentially forming, on the conductive layer, a second dielectric layer, a first dielectric layer and a mask layer which are superposed one upon the other, the first dielectric layer being in a strip shape, the first dielectric layer and the second dielectric layer extending into the first region from the second region, the mask layer covering the first region and exposing the second region;
etching the second dielectric layer for a first time;
removing the mask layer in the first region to expose the first region;
etching the second dielectric layer for a second time, forming, respectively in the first region and the second region, a first window and a second window exposing the conductive layer, a width of a bottom of the first window being less than a width of a bottom of the second window; and etching the exposed conductive layer, and forming the leads, the leads comprising wide lines in the first region and narrow lines in the second region, a line width of the wide lines being greater than a line width of the narrow lines.

2. The preparation method according to claim 1, wherein the substrate further has a peripheral region, the peripheral region is located on a side of the first region away from the second region, and the mask layer also covers the peripheral region, wherein the removing the mask layer in the first region to expose the first region comprises:

carrying out isotropic etching on the mask layer, removing the mask layer in the first region and reserving the mask layer in the peripheral region, to expose the first region.

3. The preparation method according to claim 2, wherein the isotropic etching is isotropic dry etching.

4. The preparation method according to claim 1, further comprising:

forming, between the conductive layer and the second dielectric layer, a third dielectric layer, wherein the etching the second dielectric layer for a second time, forming, respectively in the first region and the second region, a first window and a second window exposing the conductive layer comprises:

etching the second dielectric layer for the second time, forming, respectively in the first region and the second region, a first groove and a second groove exposing the third dielectric layer, a width of a bottom of the first groove being less than a width of a bottom of the second groove; and carrying out anisotropic dry etching on the exposed third dielectric layer in a vertical direction, forming, respectively in the first region and the second region, the first window and the second window exposing the conductive layer.

5. The preparation method according to claim 1, wherein the etching the second dielectric layer for a first time comprises: etching an exposed top part of the second dielectric layer and reserving a bottom part of the second dielectric layer.

6. The preparation method according to claim 4, wherein the etching the second dielectric layer for a first time comprises: etching the second dielectric layer in the vertical direction, at least a top part of a side cross-section of the second groove being rectangular; and the etching the second dielectric layer for a second time comprises: etching the second dielectric layer in an inclined direction, a side cross-section of the first groove being an inverted trapezoid.

7. The preparation method according to claim 1, wherein the first dielectric layer is in the shape of strips with equal width.

8. The preparation method according to claim 1, further comprising:

forming, over the first region, contact pillars in contact with the wide lines.

9. The preparation method according to claim 8, wherein a source region and a drain region are formed in the substrate and the narrow lines are electrically connected to the source region or the drain region.

10. The preparation method according to claim 2, wherein the etching the second dielectric layer for a first time comprises: etching an exposed top part of the second dielectric layer and reserving a bottom part of the second dielectric layer.

11. The preparation method according to claim 3, wherein the etching the second dielectric layer for a first time comprises: etching an exposed top part of the second dielectric layer and reserving a bottom part of the second dielectric layer.

12. The preparation method according to claim 4, wherein the etching the second dielectric layer for a first time comprises: etching an exposed top part of the second dielectric layer and reserving a bottom part of the second dielectric layer.

13. The preparation method according to claim 4, wherein etching rates for the first dielectric layer, the second dielectric layer, the third dielectric layer and the mask layer are different.

14. The preparation method according to claim 13, wherein the first dielectric layer comprises a silicon oxide layer, the second dielectric layer comprises a silicon oxynitride layer, and the third dielectric layer comprises an amorphous carbon layer.

15. The preparation method according to claim 1, wherein the conductive layer is a metal layer and the leads are metal leads.

* * * * *